(12) United States Patent
Ning et al.

(10) Patent No.: US 9,373,649 B2
(45) Date of Patent: Jun. 21, 2016

(54) ARRAY SUBSTRATE AND METHOD FOR MANUFACTURING THE SAME, AND DISPLAY DEVICE

(71) Applicant: BOE TECHNOLOGY GROUP CO., LTD., Beijing (CN)

(72) Inventors: Ce Ning, Beijing (CN); Wei Yang, Beijing (CN); Ke Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/422,342

(22) PCT Filed: Jun. 30, 2014

(86) PCT No.: PCT/CN2014/081191
§ 371 (c)(1),
(2) Date: Feb. 18, 2015

(87) PCT Pub. No.: WO2015/043268
PCT Pub. Date: Apr. 2, 2015

(65) Prior Publication Data
US 2016/0035760 A1    Feb. 4, 2016

(30) Foreign Application Priority Data
Sep. 26, 2013  (CN) .......................... 2013 1 0446616

(51) Int. Cl.
H01L 29/10     (2006.01)
H01L 27/12     (2006.01)
G02F 1/1343    (2006.01)

(52) U.S. Cl.
CPC ........ *H01L 27/1248* (2013.01); *H01L 27/1259* (2013.01); *H01L 27/1288* (2013.01); *G02F 2001/134372* (2013.01)

(58) Field of Classification Search
CPC ............ H01L 27/1248; H01L 27/1259; H01L 51/107
USPC ............................................................ 257/43
See application file for complete search history.

(56) References Cited

U.S. PATENT DOCUMENTS

2007/0072439 A1 *  3/2007  Akimoto ............. H01L 27/1225
                                                    438/795
2010/0134740 A1 *  6/2010  Nakao ................ G02F 1/136204
                                                    349/138

(Continued)

FOREIGN PATENT DOCUMENTS

CN        102024852 A      4/2011
CN        102629046 A      8/2012

(Continued)

OTHER PUBLICATIONS

First Office Action dated Dec. 29, 2014 corresponding to application No. 201310446616.7.

(Continued)

*Primary Examiner* — Tu-Tu Ho
(74) *Attorney, Agent, or Firm* — Nath Goldberg & Meyer; Joshua B. Goldberg; Christopher Thomas

(57) ABSTRACT

The invention belongs to the field of display technology, and particularly provides an array substrate and a method for manufacturing the same, and a display device. The array substrate includes a base substrate, and a thin film transistor and driving electrodes provided on the base substrate, the thin film transistor includes a gate, a gate insulating layer, an active layer, a source and a drain, the driving electrodes include a slit-shaped electrode and a plate-shaped electrode which are located in different layers and at least partially overlap with each other in the orthographic projection direction, the source, the drain and the active layer are formed so that part of their bottom surfaces are located in the same plane, and a resin layer is further provided between the thin film transistor and the plate-shaped electrode.

18 Claims, 6 Drawing Sheets

(56) References Cited

U.S. PATENT DOCUMENTS

| | | | |
|---|---|---|---|
| 2010/0165255 A1* | 7/2010 | Ishitani | G02F 1/133603 349/69 |
| 2011/0278563 A1 | 11/2011 | Huang et al. | |
| 2013/0162926 A1 | 6/2013 | Kwack et al. | |

FOREIGN PATENT DOCUMENTS

| CN | 102681276 A | 9/2012 |
|---|---|---|
| CN | 103077944 A | 5/2013 |
| CN | 103091914 A | 5/2013 |
| CN | 103489826 A | 1/2014 |
| CN | 103676374 A | 3/2014 |
| CN | 203466192 U | 3/2014 |

OTHER PUBLICATIONS

International Search Report for International Application No. PCT/CN2014/081191.

* cited by examiner

ARRAY SUBSTRATE AND METHOD FOR MANUFACTURING THE SAME, AND DISPLAY DEVICE

This is a National Phase Application filed under 35 U.S.C. 371 as a national stage of PCT/CN2014/081191, filed Jun. 30, 2014, an application claiming the benefit of Chinese Application No. 201310446616.7, filed Sep. 26, 2013, the content of each of which is hereby incorporated by reference in its entirety.

FIELD OF THE INVENTION

The invention relates to the field of display technology, and in particular to an array substrate and a method for manufacturing the same, and a display device.

BACKGROUND OF THE INVENTION

With the development of the display technology, a flat panel display device has replaced a bulky CRT (Cathode Ray Tube) display device to become more important in people's daily life. Currently, a commonly used flat panel display device includes a LCD (Liquid Crystal Display), a PDP (Plasma Display Panel), or an OLED (Organic Light-Emitting Diode) display device.

In both a LCD and an active matrix OLED (Active Matrix Organic Light Emission Display, referred to as AMOLED) display device, thin film transistors integrated in an array substrate (referred to as TFT) function as control devices, so as to realize the image display. The thin film transistor mainly includes a gate, a gate insulating layer, an active layer, a source and a drain.

Currently, the active layer is usually made of a silicon-containing material or a metal oxide semiconductor material. When the active layer is made of the metal oxide semiconductor material, the thin film transistor has a better on-state current, better switching characteristics, high mobility, and good uniformity, does not need to add a compensation circuit, and thus can be used for applications requiring fast response and large current, for example, used in LCDs and OLED display devices of high frequency, high resolution, and large size. At the same time, the process of using the metal oxide semiconductor material to form the active layer is simple, a process such as sputtering is enough, and such a process has a good matching with the existing LCD production line, is easy to change, needs no extra equipment, and has advantages in cost.

With the increasing requirements on high pixels per inch (PPI) display, the array substrate has been improved. Currently there exists an array substrate provided with a resin layer, which is arranged above the data line. The resin layer is beneficial to improve the aperture ratio of the array substrate, and increases the effective pixel area; the resin layer can also reduce the parasitic capacitance, reduce the logical power consumption, greatly reduce the overall power consumption, improve the performance of the product, and makes the high PPI display forward.

A typical representative as the high PPI display device is an ADvanced Super Dimension Switch (referred to as ADSDS) liquid crystal display device. An ADS mode array substrate usually includes a slit-shaped electrode layer and a plate-shaped electrode layer which are provided at the same side of the liquid crystal cell, and the electric field generated between edges of slit-shaped electrodes in the same plane and the electric field generated between the slit-shaped electrode layer and the plate-shaped electrode layer constitute a multi-dimensional electric field so that all oriented liquid crystal molecules between slit-shaped electrodes and directly above the electrodes in the liquid crystal cell are rotated, to improve the operation efficiency of the liquid crystals and increase the viewing angle. However, as the current ADS mode array substrate in which the active layer is made of the metal oxide semiconductor material and the resin layer is provided therein, it is generally required nine patterning processes to manufacture the array substrate. The nine patterning processes are as follows: a gate conductive thin film is deposited on a base substrate, and a first patterning process is performed to form a gate; a gate insulating layer is deposited on the gate, an active layer is deposited on the gate insulating layer, and a second patterning process is performed to form a pattern including the active layer; an etch stop layer film is formed above the active layer, and a third patterning process is performed to form a pattern including an etch stop layer; a source/drain conductive thin film is deposited above the etch stop layer, and a fourth patterning process is performed to form a pattern including a source and a drain; a first passivation layer film is formed above the source and the drain, and a fifth patterning process is performed to form a pattern including a first passivation layer and a via hole in the first passivation layer; a resin layer film is formed above the first passivation layer, and a sixth patterning process is performed to form a pattern including a resin layer; a first electrode layer film is formed above the resin layer, and a seventh patterning process is performed to form a plate-shaped electrode; a second passivation layer film is formed above the plate-shaped electrode, and an eighth patterning process is performed to form a pattern including a second passivation layer and a via hole in the second passivation layer; and a second electrode layer film is formed above the second passivation layer, and a ninth patterning process is performed to form a slit-shape electrode.

It can be seen from the above that, with the addition of the resin layer, although the aperture ratio of the array substrate is increased, power consumption is reduced to a certain extent, and the performance of the product is improved, the manufacturing procedure of the array substrate becomes complex, and the production capacity and the product yield are reduced.

SUMMARY OF THE INVENTION

In view of the above shortages existing in the prior art, the technical problem to be solved by the invention is to provide an array substrate, a method for manufacturing the same, and a display device, and the array substrate has a compact structure, and the method for manufacturing the array substrate includes only six patterning processes, simplifies the process flow, improve the productivity, and save cost.

A technical solution employed to solve the technical problem is an array substrate, including a base substrate, and a thin film transistor and driving electrodes provided on the base substrate, the thin film transistor including a gate, a gate insulating layer, an active layer, a source and a drain, and the driving electrodes including a slit-shaped electrode and a plate-shaped electrode which are provided in different layers and at least partially overlap with each other in the orthographic projection direction, wherein the source, the drain and the active layer are formed so that part of their bottom surfaces are located in the same plane, and a resin layer is provided between the thin film transistor and the plate-shaped electrode.

Preferably, the gate is provided on the base substrate, the gate insulating layer is provided on the gate, the source and the drain are provided on the gate insulating layer with an interval therebetween, the source and the drain partially overlap with the gate in the orthographic projection direction, respectively, and the active layer is provided within a spacer region formed between the source and the drain, and extends to a top surface of the source and a top surface of a part of the drain so that bottom surfaces of the source, the drain and a part of the active layer are all located on a top surface of the gate insulating layer.

Preferably, a first protection layer is provided on the active layer, and the first protection layer and the active layer completely overlap with each other in the orthographic projection direction. Preferably, the resin layer is provided on the first protection layer, the plate-shaped electrode is provided on the resin layer, the thickness of a region, which is provided with the plate-shaped electrode, of the resin layer is larger than that of other regions, a second protection layer is provided on the plate-shaped electrode, and the slit-shaped electrode is provided on the second protection layer. Preferably, the thickness of a region, which is provided with the plate-shaped, of the resin layer is larger than that of other regions by 50-100 nm.

Preferably, the plate-shaped electrode is a common electrode, and the slit-shaped electrode is a pixel electrode; or the plate-shaped electrode is a pixel electrode, and the slit-shaped electrode is a common electrode. Preferably, the array substrate further includes a common electrode line provided in the same layer as the gate, a first via hole is provided in a region of the resin layer corresponding to the drain, a second via hole is provided in a region of the resin layer corresponding to the common electrode line, a third via hole is provided in a region of the second protection layer corresponding to the drain, and a fourth via hole is provided in a region of the gate insulating layer corresponding to the common electrode line, and the pixel electrode is electrically connected to the drain through the first via hole and the third via hole, and the common electrode is electrically connected to the common electrode line through the second via hole and the fourth via hole.

Preferably, the resin layer is made of organic resin, the organic resin includes acrylic film-forming resin, phenolic resin-typed film-forming resin, vinyl polymer film-forming resin or polymide film-forming resin, and the resin layer has a thickness in a range of 900-2100 nm.

Preferably, the active layer is made of a metal oxide semiconductor material which includes indium gallium zinc oxide, indium oxide, zinc oxide or indium tin zinc oxide, and the active layer has a thickness of 20-60 nm.

Preferably, the first protection layer and the second protection layer are mono-layered or multi-layered composite laminated structures formed of silicon oxide, silicon nitride, hafnium oxide or aluminum oxide, the first protection layer has a thickness in a range of 90-210 nm, and the second protection layer has a thickness in a range of 190-310 nm.

A display device includes the above array substrate.

A method for manufacturing an array substrate, the array substrate including a base substrate, and a thin film transistor and driving electrodes provided on the base substrate, the thin film transistor including a gate, a gate insulating layer, an active layer, a source and a drain, and the driving electrodes including a slit-shaped electrode and a plate-shaped electrode which are provided in different layers and at least partially overlap with each other in the orthographic projection direction, wherein the source, the drain and the active layer are formed so that part of their bottoms are located in the same plane, and a resin layer is provided between the thin film transistor and the plate-shaped electrode, the method includes: forming patterns of the source, the drain and the active layer by two patterning processes so that part of bottom surfaces of the source, the drain and the active layer are located in the same plane; and forming a pattern including the resin layer and the plate-shaped electrode by one patterning process.

Preferably, before the step of forming patterns of the source, the drain and the active layer by two patterning processes so that part of bottom surfaces of the source, the drain and the active layer are located in the same plane, the method further includes forming a pattern including the gate on the base substrate by one patterning process.

Preferably, the step of forming patterns of the source, the drain and the active layer by two patterning processes so that part of bottom surfaces of the source, the drain and the active layer are located in the same plane includes: forming a gate insulating layer on the base substrate formed with the pattern including the gate, and forming a pattern including the source and the drain on the gate insulating layer so that the source and the drain are provided with an interval therebetween; and on the base substrate subjected to the above step, forming a pattern including the active layer and a first protection layer by one patterning process so that the active layer is provided within a spacer region formed between the source and the drain, and extends to a top surface of the source and a top surface of a part of the drain, bottom surfaces of the source, the drain and a part of the active layer are all located on a top surface of the gate insulating layer, and the first protection layer and the active layer completely overlap with each other in the orthographic projection direction.

Preferably, by the step of forming a pattern including the resin layer and the plate-shaped electrode by one patterning process, the thickness of the resin layer at the region provided with the plate-shaped electrode is made to be larger than that at other regions.

Preferably, by the step of forming a pattern including the resin layer and the plate-shaped electrode by one patterning process, the thickness of a region, which is provided with the plate-shaped electrode, of the resin layer is made to be larger than that of other regions by 50-100 nm.

Preferably, the method further includes: on the base substrate formed with the plate-shaped electrode, forming a pattern including a second protection layer by one patterning process; and on the base substrate subjected to the above step, forming a pattern including the slit-shaped electrode by one patterning process.

Preferably, the step of forming a pattern including the resin layer and the plate-shaped electrode by one patterning process includes: forming a resin material layer film, and forming a first conductive layer film on the resin material layer film; performing exposure on the resin material layer film using a half tone mask plate or a gray tone mask plate wherein a region of the resin material layer film corresponding to the drain is a region at which resin material is completely removed, a region of the resin material layer film corresponding to the plate-shaped electrode is a region at which resin material is completely remained, and other regions are regions at which resin material is partially remained; and performing development on the base substrate subjected to the above steps to form a pattern including the resin layer and the plate-shaped electrode.

Preferably, by the step of forming a pattern including the resin layer and the plate-shaped electrode by one patterning process, the thickness of a region, which is provided with the plate-shaped electrode, of the resin layer is made to be larger than that of other regions by 50-100 nm.

Preferably, the plate-shaped electrode is a common electrode, and the slit-shaped electrode is a pixel electrode; or the plate-shaped electrode is a pixel electrode, and the slit-shaped electrode is a common electrode, the method further includes:

forming a pattern including a common electrode line simultaneously with forming the pattern including the gate;

forming a fourth via hole in a region of the gate insulating layer corresponding to the common electrode line simultaneously with forming the gate insulating layer;

forming a first via hole in a region of the resin layer corresponding to the drain and a second via hole in a region of the resin layer corresponding to the common electrode line simultaneously with forming the pattern including the resin layer; and forming a third via hole in a region of the second protection layer corresponding to the drain simultaneously with forming the second protection layer;

wherein the pixel electrode is electrically connected to the drain through the first via hole and the third via hole, and the common electrode is electrically connected to the common electrode line through the second via hole and the fourth via hole.

The advantageous effects of the invention are as follows. Compared to the array substrate in which the active layer is made of the metal oxide semiconductor material and the resin layer is incorporated therein in the prior art, in the array substrate of the invention, the source, the drain and the active layer are formed so that part of bottom surfaces of the source, the drain and the active layer are located in the same plane, and the first protection layer and the active layer completely overlap with each other, so unlike the prior art, it is not required to provide the etch stop layer on the active layer and provide the first passivation layer on the source and the drain. Moreover, in the invention, the active layer and the first protection layer may be simultaneously formed by a single patterning process. Therefore, compared to the prior art, two patterning processes are saved; while the resin layer and the plate-shaped electrode are simultaneously formed by a single patterning process (the plate-shaped electrode is simultaneously formed by the exposure and development processes for forming the resin layer) without requiring to perform a separate patterning process for forming the plate-shaped electrode, which will save one patterning process. Therefore, compared to the array substrate in which the active layer is made of the metal oxide semiconductor material and the resin layer is incorporated therein in the prior art, the array substrate in which the active layer is made of the metal oxide semiconductor material and the active layer is incorporated therein of the invention has a more compact structure, and is more applicable to a product of high PPI, high aperture ratio and low power consumption; at the same time, three patterning processes are saved in the method for manufacturing the array substrate (only six patterning processes are required to manufacture the entire array substrate), which not only simplifies the process flow, greatly increases the productivity, saves cost and facilitate increase in the product yield.

BRIEF DESCRIPTION OF THE DRAWINGS

FIGS. 2A to 2F are cross-sectional views of structures formed by respective steps in a method for manufacturing the array substrate in FIGS. 1A and 1B, wherein, FIG. 2A is a cross-sectional view of a structure formed with a pattern including a gate on a base substrate;

FIGS. 2B-1 and 2B-2 are cross-sectional views of structures formed with a gate insulating layer, a source and a drain, wherein FIG. 2B-1 is a cross-sectional view of a structure formed with the gate insulating layer; and FIG. 2B-2 is a cross-sectional view of a structure formed with a pattern including the source and the drain;

FIG. 2C is a cross-sectional view of a structure formed with a pattern including an active layer and a first protection layer;

FIGS. 2D-1 to 2D-3 are cross-sectional views of structures formed with a pattern including a resin layer and a plate-shaped electrode, wherein FIG. 2D-1 is a cross-sectional view of a structure formed with a resin layer film and a first conductive layer film; FIG. 2D-2 is a diagram illustrating exposure performed on the resin layer film and the first conductive layer film; and FIG. 2D-3 is a cross-sectional view of a structure formed with a pattern including the resin layer, a via hole in the resin layer and the plate-shaped electrode;

FIG. 2E is a cross-sectional view of a structure formed with a pattern including a second protection layer; and FIG. 2F is a cross-sectional view of a structure formed with a slit-shaped electrode.

FIG. 3 is a schematic view of a structure of an array substrate in Embodiment 2 of the invention.

REFERENCE SIGNS

Figure 1A:
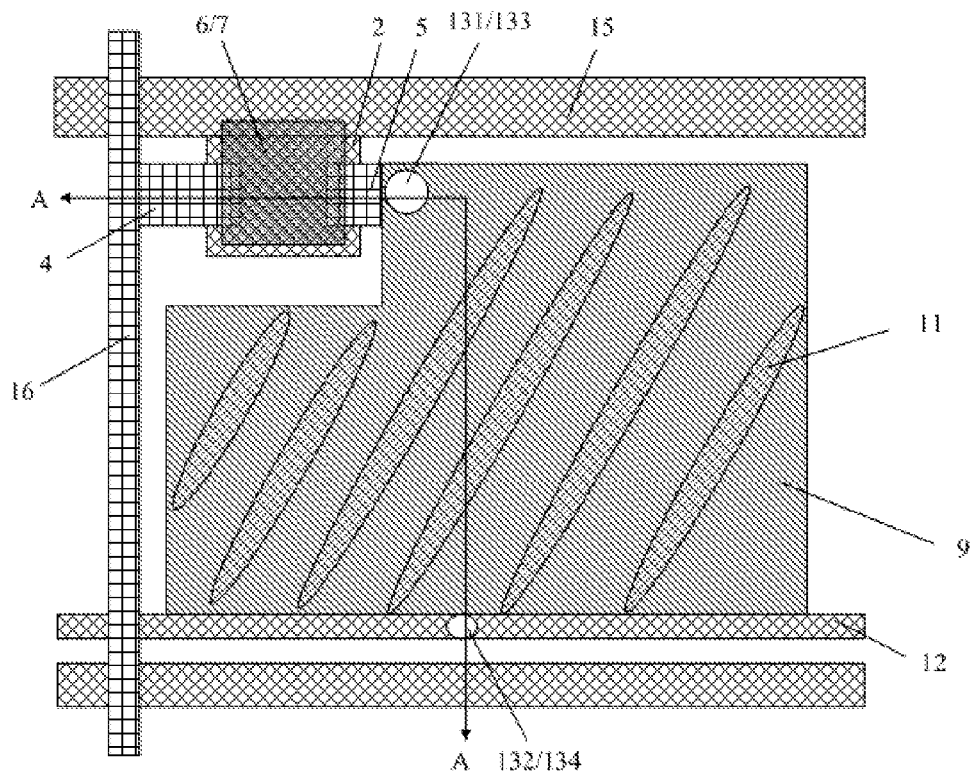
FIG. 1A is a plan view of an array substrate in Embodiment 1 of the invention.

1—base substrate; 2—gate; 3—gate insulating layer; 4—source; 5—drain; 6—active layer; 7—first protection layer; 8—resin layer; 80—resin material layer film; 9—plate-shaped electrode; 90—first conductive layer film; 10—second protection layer; 11—slit-shaped electrode; 12—common electrode line; 131—first via hole; 132—second via hole; 133—third via hole; 134—fourth via hole; 14—connection electrode; 15—gate line; and 16—data line.

DETAILED DESCRIPTION OF THE EMBODIMENTS

In order to make persons skilled in the art better understand the technical solutions of the invention, the array substrate, the method for manufacturing the same, and the display device will be described in detail below in conjunction with the drawings and the embodiments.

The invention provides an array substrate including a base substrate, and a thin film transistor and driving electrodes provided on the base substrate, the thin film transistor includes a gate, a gate insulating layer, an active layer, a source and a drain, and the driving electrodes include a slit-shaped electrode and a plate-shaped electrode which are provided in different layers and at least partially overlap with each other in the orthographic projection direction, wherein the source, the drain and the active layer are formed so that part of their bottoms are located in the same plane, and a resin layer is provided between the thin film transistor and the plate-shaped electrode.

The invention further provides a display device including the above array substrate.

The invention further provides a method for manufacturing an array substrate, including a step of forming a thin film transistor and driving electrodes on a base substrate, so that the thin film transistor includes a gate, a gate insulating layer, an active layer, a source and a drain, and the driving electrodes include a slit-shaped electrode and a plate-shaped electrode which partially overlap with each other in the orthographic injection direction, wherein the source, the drain and the active layer are formed by two patterning processes, and part of their bottoms are located in the same plane, a resin layer is provided between the thin film transistor and the plate-shaped electrode, and the resin layer and the plate-shaped electrode are formed by one patterning process.

Embodiment 1

The present embodiment provides an array substrate including a base substrate, and a thin film transistor and driving electrodes provided on the base substrate, the thin film transistor includes a gate, a gate insulating layer, an active layer, a source and a drain, and the driving electrodes include a slit-shaped electrode and a plate-shaped electrode which are provided in different layers and at least partially overlap with each other in the orthographic projection direction, wherein the source, the drain and the active layer are formed so that part of their bottoms are located in the same plane, and a resin layer is provided between the thin film transistor and the plate-shaped electrode.

Figure 1B:
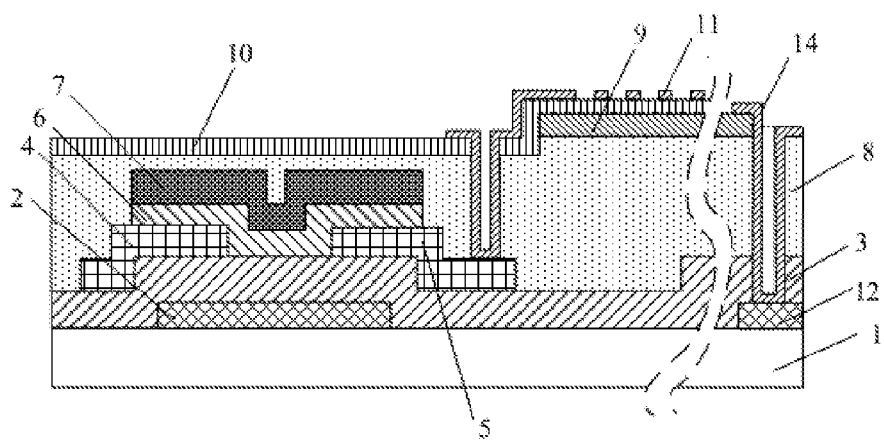
FIG. 1B is a cross-sectional view of the array substrate in FIG. 1A taken along the A-A section line.

As shown in FIGS. 1A and 1B, a gate 2 is provided on a base substrate 1, a gate insulating layer 3 is provided on the gate 2, a source 4 and a drain 5 are provided on the gate insulating layer 3 with an interval therebetween, the source 4 and the drain 5 partially overlap with the gate 2 in the orthographic projection direction respectively, and an active layer 6 is provided within a spacer region formed between the source 4 and the drain 5 and extends to the top surfaces of the source 4 and a part of the drain 5 so that bottoms of the source 4, the drain 5 and a part of the active layer 6 are all located on the top surface of the gate insulating layer 3. The entire gate insulating layer 3 is provided on the gate 2; at the same time, in order to facilitate electrical connection between the thin film transistor (for example, the drain) and a driving electrode (for example, the pixel electrode), preferably the active layer 6 partially covers the drain 5 so that it is easy to make the exposed part of the drain electrically connected to the pixel electrode; while the active layer 6 may partially or completely cover the source 4.

A first protection layer 7 is provided on the active layer 6, the first protection layer 7 and the active layer 6 completely overlap with each other in the orthographic projection direction, and the first protection layer 7 prevents the active layer 6 from being influenced by the subsequently provided resin layer, and facilitates simultaneous formation of the first protection layer 7 and the active layer 6 by a single patterning process and facilitates the subsequent formation of a via hole for electrically connecting the thin film transistor with the driving electrode.

A resin layer 8 is provided on the first protection layer 7, a plate-shaped electrode 9 is provided on the resin layer 8, the thickness of the resin layer 8 at a region provided with the plate-shaped electrode 9 is larger than that at other regions, a second protection layer 10 is provided on the plate-shaped electrode 9, and a slit-shaped electrode 11 is provided on the second protection layer 10.

As shown in FIGS. 1A and 1B, the array substrate further includes a common electrode line 12 provided in the same layer as the gate 2. In the present embodiment, the plate-shaped electrode 9 is a common electrode, a second via hole 132 is provided in a region of the resin layer 8 corresponding to the common electrode line 12 (the second via hole 132 is not shown in FIG. 1B, since a connection electrode 14 is already provided therein), a fourth via hole 134 is provided in a region of the gate insulating layer 3 corresponding to the common electrode line 12 (the fourth via hole 134 is not shown in FIG. 1B, since the connection electrode 14 is already provided therein), and the common electrode is electrically connected to the common electrode line 12 through the second via hole 132 and the fourth via hole 134; the slit-shaped electrode 11 is a pixel electrode, a first via hole 131 is provided in a region of the resin layer 8 corresponding to the drain 5 (the first via hole 131 is not shown in FIG. 1B, since the pixel electrode is already provided therein), a third via hole 133 is provided in a region of the second protection layer 10 corresponding to the drain 5 (the third via hole 133 is not shown in FIG. 1B, since the pixel electrode is already provided therein), and the pixel electrode is electrically connected to the drain 5 through the first via hole 131 and the third via hole 133.

In the above array substrate, since the resin layer is provided between the thin film transistor and the plate-shaped electrode, the parasitic capacitance between a data line 16 and the common electrode can be effectively reduced, and the stability of the array substrate can be improved.

Correspondingly, a method for manufacturing the above array substrate includes a step of forming a thin film transistor and driving electrodes on a base substrate, so that the thin film transistor includes a gate, a gate insulating layer, an active layer, a source and a drain, and the driving electrodes include a slit-shaped electrode and a plate-shaped electrode which partially overlap with each other in the orthographic injection direction, wherein the source, the drain and the active layer are formed by two patterning processes, and part of their bottoms are located in the same plane, a resin layer is provided between the thin film transistor and the plate-shaped electrode, and the resin layer and the plate-shaped electrode are formed by one patterning process.

Before the detailed description is set forth, it should be understood that, in the invention, the patterning process may only include a photolithographic process, or may include a photolithographic process and an etching process, and may also include printing, inkjetting or any other process for forming a predetermined pattern; and the photolithographic process refers to a pattern forming process including processes such as film formation, exposure, development using photoresist, a mask plate, an exposure machine etc. A corresponding patterning process can be selected according to the structure to be formed in the invention.

In particular, the method for manufacturing the above array substrate includes the following steps S1 to S6.

Step S1: forming a pattern including the gate on the base substrate by one patterning process.

Figure 2A:
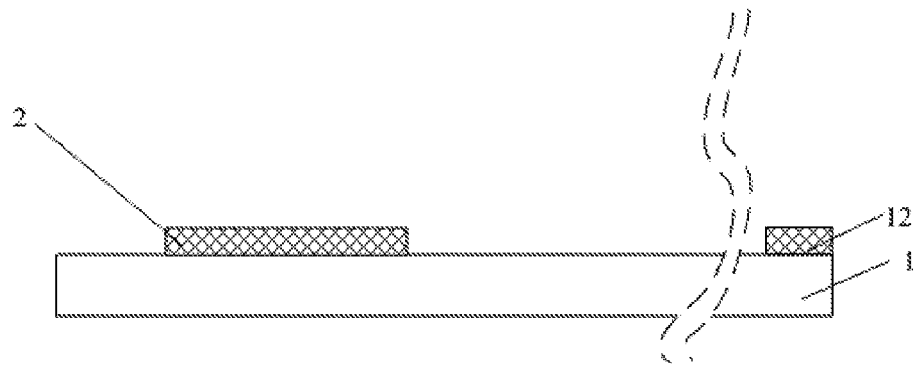

As shown in FIG. 2A, a gate metal thin film is formed on the base substrate 1, and the pattern including the gate 2 is formed by one patterning process. For example, the gate metal thin film is formed on the base substrate 1 by deposition, sputtering (magnetron sputtering) or thermal evaporation.

Further, simultaneously with forming the pattern including the gate 2, a pattern including the common electrode line 12 and a gate line 15 (not shown in FIG. 2A, please referring to FIG. 1A) is formed, and the common electrode line 12 is to be electrically connected to the common electrode which will be formed in the subsequent process; the gate line 15 is electrically connected to the gate 2, which belongs to the prior art and will not be elaborated herein.

Preferably, the gate 2, the common electrode line 12 and the gate line 15 are mono-layered or multi-layered composite laminated structures formed of molybdenum (Mo), molybdenum niobium alloy (MoNb), aluminum (Al), aluminum neodymium alloy (AlNd), titanium (Ti), chromium (Cr) or copper (Cu), and the gate 2, the common electrode line 12 and the gate line 15 have thicknesses in a range of 100-500 nm, preferably 200-400 nm.

Step S2: forming the gate insulating layer on the base substrate subjected to Step S1, and forming a pattern including the source and the drain on the gate insulating layer by one patterning process so that the source and the drain are provided with an interval therebetween.

Figures 1, 2B:
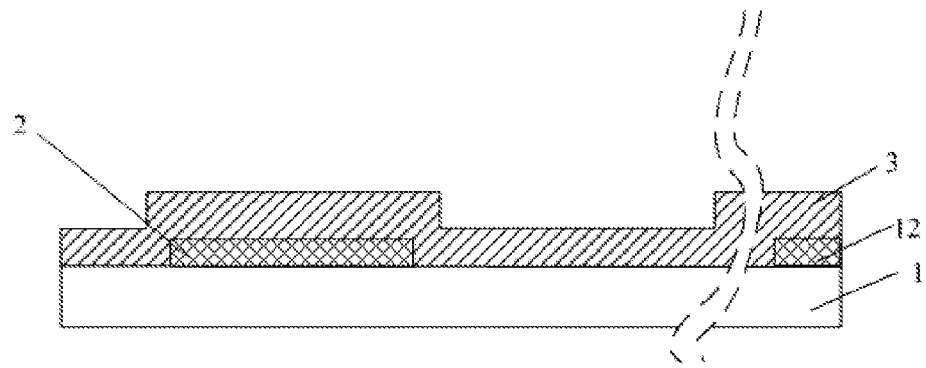
Figures 2, 2B:
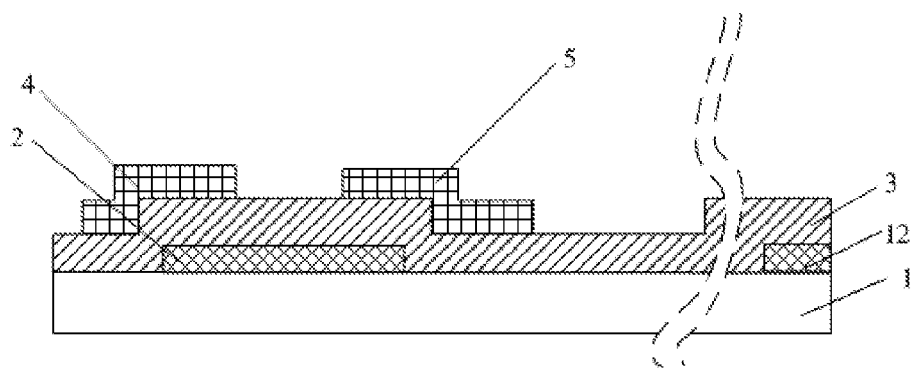

As shown in FIG. 2B-1, in this step, a gate insulating layer thin film is formed on the base substrate subjected to Step S1, that is, the gate insulating layer 3 is formed on the gate 2. Then, as shown in FIG. 2B-2, a source-drain metal thin film is formed on the gate insulating layer 3 by deposition, sputtering (magnetron sputtering) or thermal evaporation, and the pattern including the source 4 and the drain 5 is formed by one patterning process in such a way that the source 4 and the drain 5 are provided with an interval therebetween.

The gate insulating layer 3 is formed by plasma enhanced chemical vapor deposition (PECVD), and the gate insulating layer 3 is a mono-layered or multi-layered composite laminated structure formed of silicon oxide (SiOx), silicon nitride (SiNx), hafnium oxide (HfOx), silicon nitride oxide (SiON) or aluminum oxide (AlOx), and the gate insulating layer 3 has a thickness in the range 200-500 nm, preferably 300-400 nm.

It should be understood that, since the gate insulating layer 3 is generally made of a transparent material (silicon oxide, silicon nitride, hafnium oxide, silicon nitride oxide, aluminum oxide) and will not affect the observation of the plan view, so the gate insulating layer 3 is omitted in the plan view of FIG. 1A (the same to the first and second protection layers); at the same time, in order to facilitate understanding of structures of respective layers in the array substrate and position relationships among the respective layers, the respective layers shown in the plan view of FIG. 1A have certain transparency.

The source 4 and the drain 5 are made of at least one of indium gallium zinc oxide (IGZO), indium zinc oxide (IZO), indium tin oxide (ITO) and indium gallium tin oxide, the source 4 and the drain 5 have a thickness in the range of 100-500 nm, preferably 200-400 nm.

Step S3: forming a pattern including the active layer and a first protection layer on the base substrate subjected to Step S2 by one patterning process so that the active layer is provided within a spacer region formed between the source and the drain, and extends to a top surface of the source and a top surface of a part of the drain, bottom surfaces of the source, the drain and a part of the active layer are all located on a top surface of the gate insulating layer, and the first protection layer and the active layer completely overlap with each other in the orthographic projection direction.

Figure 2C:
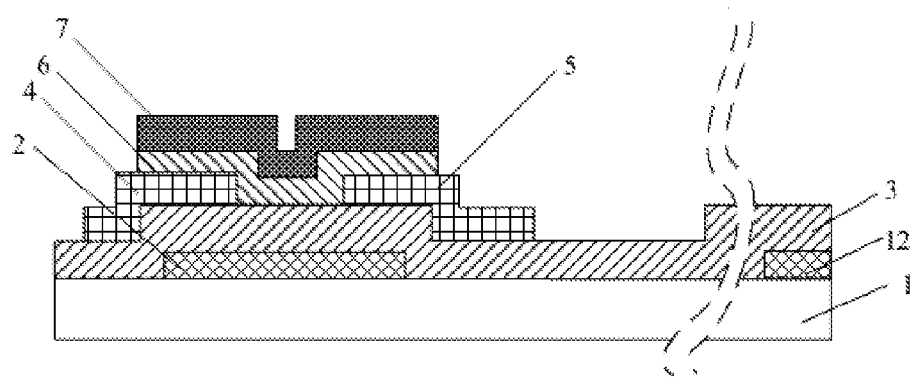

As shown in FIG. 2C, in this step, an active layer thin film is formed on the base substrate subjected to Step S2 by deposition, sputtering (including magnetron sputtering) or thermal evaporation, and a first protection layer thin film is then formed on the active layer thin film by plasma enhanced chemical vapor deposition. In the present embodiment, an active layer 6 and a first protection layer 7 are formed after the source 4 and the drain 5 are formed, the active layer 6 is formed by wet etching, the first protection layer 7 is formed by dry etching, and the active layer 6 and the first protection layer 7 have identical patterns. Compared with the structure of the array substrate in the prior art, the etch stop layer can be omitted, and one patterning process for forming the pattern including the etch stop layer is correspondingly reduced.

The active layer 6 is made of a metal oxide semiconductor material which includes at least one of indium gallium zinc oxide (IGZO), indium oxide ($In_2O_3$), zinc oxide (ZnO) and indium tin zinc oxide (ITZO), the active layer 6 has a thickness in a range of 20-60 nm, preferably 30-50 nm. Herein, it should be understood that, the metal oxide semiconductor material is a compound formed by one or more elements from indium (In), gallium (Ga), zinc (Zn) and tin (Sn) etc. and oxygen element.

The first protection layer 7 is a mono-layered or multi-layered composite laminated structure, and is formed of at least one of silicon oxide, silicon nitride, hafnium oxide and aluminum oxide, and the first protection layer 7 has a thickness in a range of 90-210 nm, preferably 100-200 nm.

Step S4: forming a pattern including the resin layer and the plate-shaped electrode on the base substrate subjected to Step S3 by one patterning process, so that the thickness of the resin layer at a region provided with the plate-shaped electrode is larger than that at other regions.

In the present embodiment, the plate-shaped electrode is a common electrode.

The Step S4 particularly includes the following sub-Steps S41 to S43.

Step S41: forming a resin material layer film on the base substrate subjected to Step S3, and forming a first conductive layer film on the resin material layer film.

Figures 1, 2D:
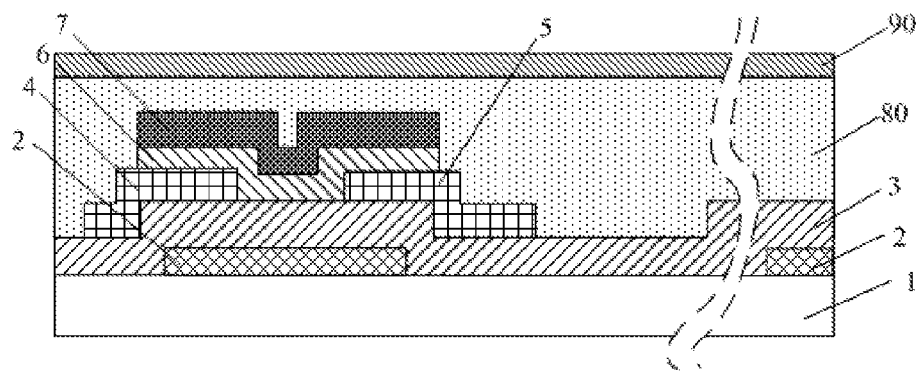
Figures 2, 2D:
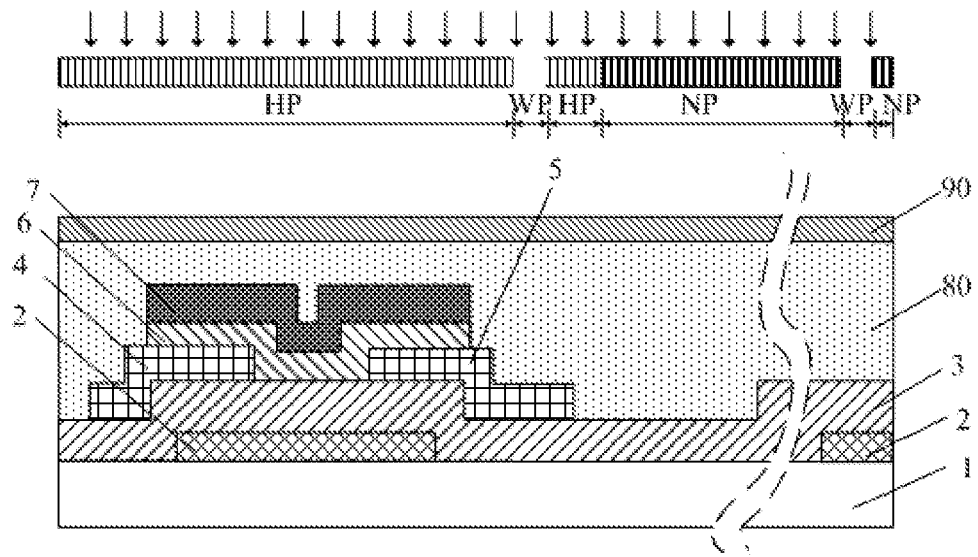

As shown in FIG. 2D-1, a resin material layer film 80 is formed on the first protection layer 7 by application (including spin coating), and forming a first conductive layer film 90 by deposition, sputtering (including magnetron sputtering) or thermal evaporation.

The resin material layer film 80 is made of organic resin, wherein the organic resin includes acrylic film-forming resin, phenolic resin-typed film-forming resin, vinyl polymer film-forming resin or polymide film-forming resin, and the resin material layer film 80 has a thickness in a range of 1000-2100 nm, preferably 1000-2000 nm; the first conductive layer film 90 is used to form the common electrode, the first conductive layer film 90 is made of at least one of transparent conductive materials including indium gallium zinc oxide (IGZO), indium zinc oxide (IZO), indium tin oxide (ITO), indium gallium tin oxide (InGaSnO) and the like, and the formed common electrode has a thickness in a range of 20-60 nm, preferably 30-50 nm.

Step S42: performing exposure on the resin material layer film 80 using a half tone mask plate or a gray tone mask plate, wherein a region of the resin material layer film 80 corresponding to the drain is a region at which resin material is completely removed (WP), a region of the resin material layer film 80 corresponding to the plate-shaped electrode is a region at which resin material is completely remained (NP), and other regions are regions at which resin material is partially remained (HP).

Further, a region of the resin material layer film 80 corresponding to the common electrode line is also a region at which resin material is completely removed (WP). As shown in FIG. 2D-2, in this step, the half tone mask plate or the gray tone mask plate is used to control the amount of transmitted light during the exposure, and thus to control exposure degrees at various regions of the resin material layer film 80, and further the resin layer 8 with different thicknesses as desired is obtained.

In the FIG. 2D-2, NP represents a region at which resin material is completely remained, HP represents a region at which resin material is partially remained, and WP represents a region at which resin material is completely removed. Regions of the resin layer 8 corresponding to the drain 5 and the common electrode line 12 are regions at which resin material is completely removed, to facilitate formation of a first via hole 131 for electrically connecting the pixel electrode with the drain 5, and formation of a second via hole 132 for electrically connecting the common electrode with the common electrode line 12.

Step S43: performing development on the base substrate subjected to Step S42 to form a pattern including the resin layer and the plate-shaped electrode.

Figures 2, 2D, 3:
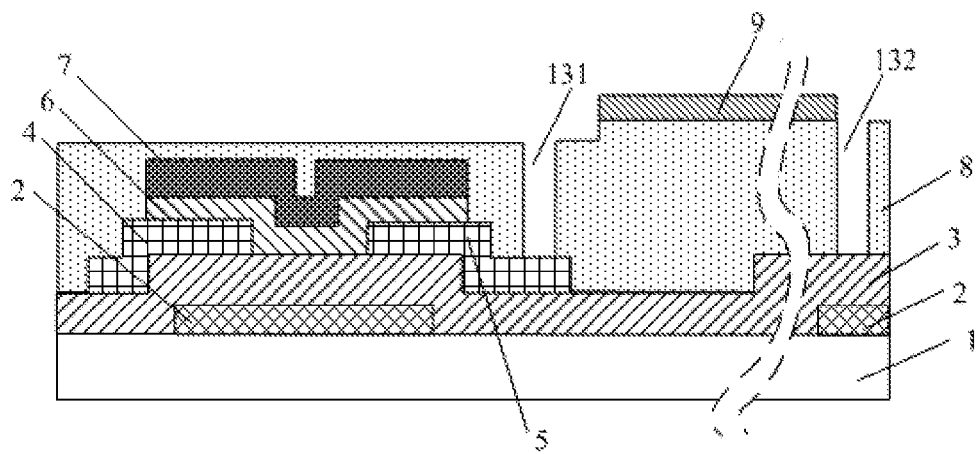

As shown in FIGS. 2D-2 and 2D-3, in this step, in corresponding cases of the resin material layer film 80 to be removed or remained in Step S42, resin material at corresponding regions will be removed or remained to form a pattern including the resin layer 8. Further, since the transparent conductive material of the first conductive layer film 90 forming the first conductive layer is attached onto the resin material layer film 80, and the first conductive layer film 90 has a very small thickness (for example 40 nm), so when the resin material layer film 80 is removed, the transparent conductive material attached thereon is also removed, therefore the plate-shaped electrode formed from the first conductive layer film 90 can be formed without etching, and the plate-shaped electrode 9 has the same shape as the thicker region of the resin layer 8.

That is, in Step S4, by the patterning process, the thickness of the region of the resin layer 8 corresponding to the plate-shaped electrode 9 is made to be larger than that at other regions (other than regions provided with the first and second via holes) by 50-100 nm, so that in the manufacturing procedure of the array substrate, a part of the first conductive layer film 90 can be effectively removed to form the plate-shaped electrode, and a certain thickness difference between the source/the drain and the plate-shaped electrode can be ensured to obtain a high aperture ratio. That is, the first conductive layer film 90 at the region without the plate-shaped electrode 9 is removed along with the remove of the resin material layer film 80 so that the resin layer 8 has different thicknesses at different regions. Further, in the resin layer 8, the first via hole 131 is formed at the region corresponding to the drain 5, and the second via hole 132 is formed at the region corresponding to the common electrode line 12.

Step S5: forming a pattern including the second protection layer on the base substrate subjected to Step S4 by one patterning process.

Figure 2E:
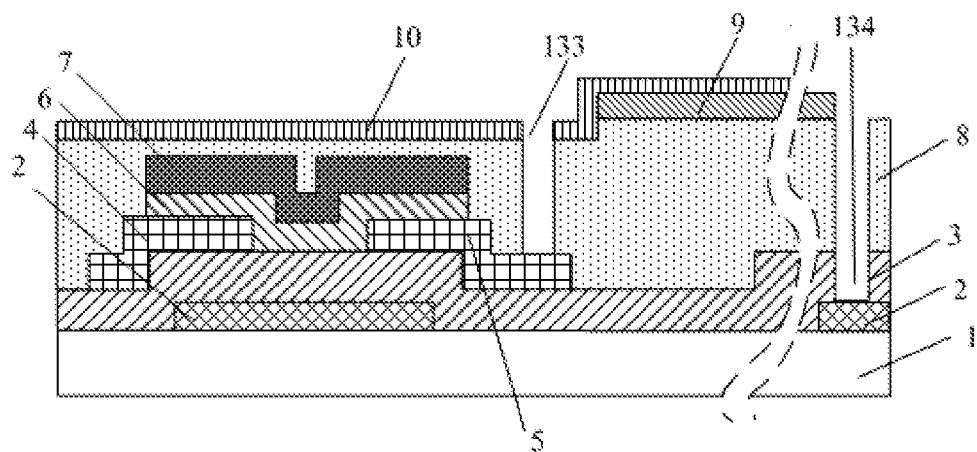

As shown in FIG. 2E, in this step, a second protection layer thin film is formed on the resin layer 8 and the plate-shaped electrode 9 on the base substrate subjected to Step S4 by plasma enhanced chemical vapor deposition; then, the pattern including a second protection layer 10 is formed by one patterning process.

The second protection layer 10 is made of at least one of silicon oxide, silicon nitride, hafnium oxide and aluminum oxide. The second protection layer 10 is of a mono-layered or multi-layered composite laminated structure, and has a thickness in a range of 190-310 nm, preferably 200-300 nm.

In this step, a third via hole 133 is provided in a region of the second protection layer 10 corresponding to the drain 5, and the third via hole 133 and the first via hole 131 at least partially overlap with each other in the orthographic projection direction, preferably completely overlap; at the same time, a part of the second protection layer 10 corresponding to a part of the common electrode close to the common electrode line is removed to expose the part of the common electrode, thus facilitating the subsequent electrical connection between the common electrode and the common electrode line 12.

In this step, a fourth via hole 134 is simultaneously formed in a region of the gate insulating layer 3 corresponding to the common electrode line 12, and the second via hole 132 and the fourth via hole 134 at least partially overlap with each other in the orthographic projection direction, preferably completely overlap.

Step S6: forming a pattern including the slit-shaped electrode on the base substrate subjected to Step S5 by one patterning process.

In the present embodiment, the slit-shaped electrode 11 is a pixel electrode. In this step, a transparent conductive layer film is formed by deposition, sputtering (including magnetron sputtering) or thermal evaporation.

Figure 2F:
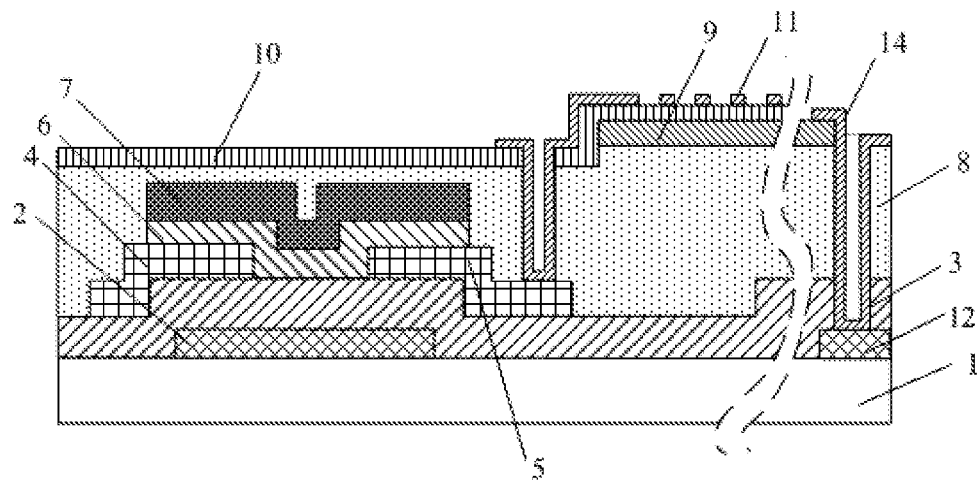
Figure 3:
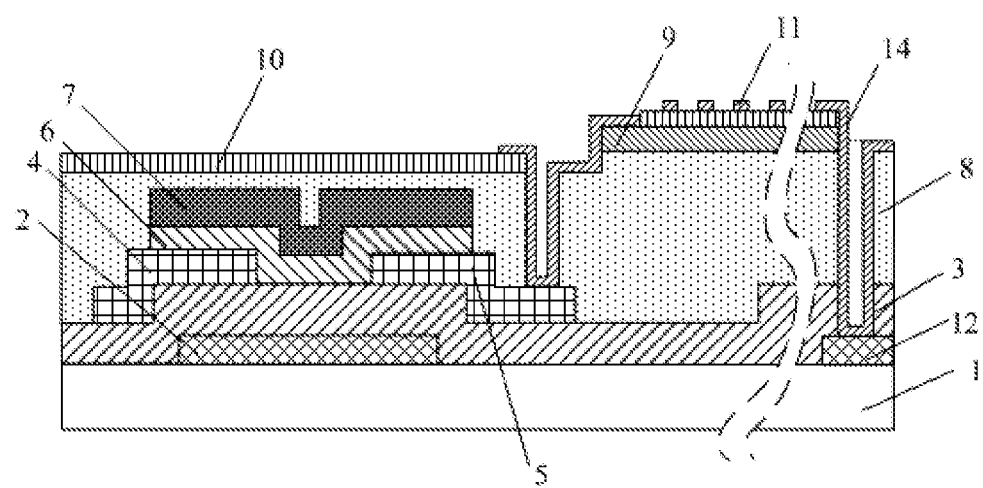

As shown in FIG. 2F, in this step, the pixel electrode with distributed slits is formed, and the pixel electrode is electrically connected to the drain 5 through the first via hole 131 and the third via hole 133; at the same time, after this step, a connection electrode 14 is formed in the second via hole 132 and the fourth via hole 134, so as to make the common electrode formed in Step S4 be electrically connected to the common electrode line 12 through the connection electrode 14.

In the present embodiment, the pixel electrode and the connection electrode 14 are made of at least one of transparent conductive materials such as indium gallium zinc oxide (IGZO), indium zinc oxide (IZO), indium tin oxide (ITO), indium gallium tin oxide (InGaSnO) and the like, the thickness of the pixel electrodes is in a range of 20-110 nm, preferably 30-100 nm.

In the present embodiment, since the active layer of the thin film transistor is made of metal oxide semiconductor material so that electron mobility between the source and the drain is increased to obtain excellent electron mobility between the source and the drain, thus improving the switching characteristics of the thin film transistor. Moreover, since the resin layer is provided between the thin film transistor and the plate-shaped electrode, the parasitic capacitance (for example, the parasitic capacitance between the data line and the common electrode) is greatly reduced, thereby reducing the logic power consumption, and greatly reducing the overall power consumption of the product; at the same time, the resin layer also facilitates improvement of the aperture ratio of the array substrate, thus increasing the effective pixel area and improving the performance of the product. At the same time, in the corresponding method for manufacturing the array substrate, the resin layer and the plate-shaped electrode are formed by a single patterning process (using only one mask plate), thus not only simplifying the process flow, greatly improving the productivity, and saving cost, but also facilitating improvement of the product yield.

Embodiment 2

In the present embodiment, the slit-shaped electrode and the plate-shaped electrode in the array substrate are provided in a different manner from that in Embodiment 1.

As shown in FIG. 3, in the present embodiment, the slit-shaped electrode 11 is the common electrode, the second via hole is provided in the region of the resin layer 8 corresponding to the common electrode line 12, the fourth via hole is provided in the region of the gate insulating layer 3 corresponding to the common electrode line 12, and the common electrode is electrically connected to the common electrode line 12 through the second and fourth via holes; the plate-shaped electrode 9 is the pixel electrode, the first via hole is provided in the region of the resin layer 8 corresponding to the drain 5, the third via hole is provided in the region of the second protection layer 12 corresponding to the drain 5, and the pixel electrode is electrically connected to the drain 5 through the first and third via holes.

Correspondingly, the method for manufacturing the above array substrate in particular includes the following steps S1 to S6.

Step S1: forming a pattern including the gate on the base substrate by one pattering process.

The same as in Embodiment 1, this step simultaneously includes forming a pattern including the common electrode line 12.

Step S2: forming the gate insulating layer on the base substrate subjected to Step S1, and forming a pattern including the source and the drain on the gate insulating layer by one patterning process so that the source and the drain are provided with an interval therebetween.

Step S3: forming a pattern including the active layer and the first protection layer on the base substrate subjected to Step S2 by one patterning process so that the active layer is provided within a spacer region formed between the source and the drain, and extends to a top surface of the source and a top surface of a part of the drain, bottom surfaces of the source, the drain and a part of the active layer are all located on a top surface of the gate insulating layer, and the first protection layer and the active layer completely overlap with each other in the orthographic projection direction.

Step S4: forming a pattern including the resin layer and the plate-shaped electrode on the base substrate subjected to Step S3 by one patterning process, so that the thickness of a region, which is provided with the plate-shaped electrode, of the resin layer is larger than that at other regions.

In this step, the first via hole is provided in the region of the resin layer corresponding to the drain, and the second via hole is provided in the region of the resin layer corresponding to the common electrode line.

Step S5: forming a pattern including the second protection layer on the base substrate subjected to Step S4 by one patterning process.

In this step, the third via hole is provided in the region of the second protection layer corresponding to the drain, and the fourth via hole is provided in the region of the resin layer corresponding to the common electrode line.

Step S6: forming a pattern including the slit-shaped electrode on the base substrate subjected to Step S5 by one patterning process.

In this step, the pixel electrode is electrically connected to the drain through the first and third via holes, and the common electrode is electrically connected to the common electrode line through the second and fourth via holes.

Other structures of the array substrate and other steps in the method for manufacturing the array substrate in the present embodiment are the same as those in Embodiment 1, and will not be elaborated herein.

In the array substrate in Embodiment 1 or 2, compared to the array substrate in which the active layer is made of the metal oxide semiconductor material and the resin layer is incorporated therein in the prior art, in the array substrate of the invention, the source, the drain and the active layer are formed so that part of bottom surfaces of the source, the drain and the active layer are located in the same plane, and the first protection layer and the active layer completely overlap with each other, so unlike the prior art, it is not required to provide the etch stop layer on the active layer and provide the first passivation layer on the source and the drain. Moreover, in the invention, the active layer and the first protection layer may be simultaneously formed by a single patterning process. Therefore, compared to the prior art, two patterning processes are saved; while the resin layer and the plate-shaped electrode are simultaneously formed by a single patterning process (the plate-shaped electrode is simultaneously formed by the exposure and development processes for forming the resin layer), without requiring to perform a separate patterning process for forming the plate-shaped electrode, which will save one pattering process. Therefore, compared to the array substrate in which the active layer is made of the metal oxide semiconductor material and the resin layer is incorporated therein in the prior art, the array substrate in which the active layer is made of the metal oxide semiconductor material and the active layer is incorporated therein of the invention has a more compact structure, and is more applicable to a product of high PPI, high aperture ratio and low power consumption; at the same time, three patterning processes are saved in the method for manufacturing the array substrate (only six patterning processes are required to manufacture the entire array substrate), which not only simplifies the process flow, greatly increases the productivity, saves cost and facilitate increase in the product yield.

Embodiment 3

The present embodiment provides a display device, including the array substrate of Embodiment 1 or 2.

The display device may be any product or component which has a display function, such as a liquid crystal panel, electronic paper, a mobile phone, a tablet computer, a TV, a monitor, a notebook computer, a digital photo frame, a navigator etc.

It should be understood that, the array substrate of the display device of this embodiment includes a slit-shaped electrode and a plate-shaped electrode which are provided in different layers and at least partially overlap in the orthographic projection direction, i.e. in an ADSDS mode. The ADSDS mode display device operates as follows: the electric field generated between edges of slit-shaped electrodes in the same plane and the electric field generated between the slit-shaped electrode layer and the plate-shaped electrode layer constitute a multidimensional electric field so that all oriented liquid crystal molecules between slit-shaped electrodes and directly above the electrodes in the liquid crystal cell are rotated, to improve the operation efficiency of the liquid crystal molecules and increase the light transmission efficiency. The ADSDS can improve image quality of the LCD product, and has advantages such as high resolution, high transmittance, low power consumption, wide viewing angle, high aperture ratio, low chromatic aberration, no push Mura and the like.

It should be understood that, the above embodiments are just exemplary embodiments employed to describe the principle of the invention, and the invention is not limited thereto. For persons skilled in the art, various variations and improvements can be made without departing from the spirit and scope of the invention, and these variations and improvements should be considered to belong to the protection scope of the invention.

The invention claimed is:

1. An array substrate, including a base substrate, and a thin film transistor and driving electrodes provided on the base substrate, the thin film transistor including a gate, a gate insulating layer, an active layer, a source and a drain, and the driving electrodes including a slit-shaped electrode and a plate-shaped electrode which are provided in different layers and at least partially overlap with each other in the orthographic projection direction, wherein the source, the drain and the active layer are formed so that part of their bottom surfaces are located in the same lane and a resin layer is provided between the thin film transistor and the plate-shaped electrode;

wherein the gate is provided on the base substrate, the gate insulating layer is provided on the gate, the source and the drain are provided on the gate insulating layer with an interval therebetween, the source and the drain partially overlap with the gate in the orthographic projection direction, respectively, and the active layer is provided within a spacer region formed between the source and the drain, and extends to a top surface of the source and a top surface of a part of the drain so that bottom surfaces of the source, the drain and a art of the active layer are all located on a top surface of the gate insulating layer;

wherein a first protection layer is provided on the active layer, and the first protection layer and the active layer completely overlap with each other in the orthographic projection direction.

2. The array substrate of claim 1, wherein the resin layer is provided on the first protection layer, the plate-shaped electrode is provided on the resin layer, the thickness of a region, which is provided with the plate-shaped electrode, of the resin layer is larger than that of other regions, a second protection layer is provided on the plate-shaped electrode, and the slit-shaped electrode is provided on the second protection layer.

3. The array substrate of claim 2, wherein the thickness of the region, which is provided with the plate-shaped electrode, of the resin layer is larger than that of other regions by 50-100 nm.

4. The array substrate of claim 1, wherein the plate-shaped electrode is a common electrode, and the slit-shaped electrode is a pixel electrode; or the plate-shaped electrode is a pixel electrode, and the slit-shaped electrode is a common electrode.

5. The array substrate of claim 4, further including a common electrode line provided in the same layer as the gate, wherein a first via hole is provided in a region of the resin layer corresponding to the drain, a second via hole is provided in a region of the resin layer corresponding to the common electrode line, a third via hole is provided in a region of the second protection layer corresponding to the drain, and a fourth via hole is provided in a region of the gate insulating layer corresponding to the common electrode line, and the pixel electrode is electrically connected to the drain through the first via hole and the third via hole, and the common electrode is electrically connected to the common electrode line through the second via hole and the fourth via hole.

6. The array substrate of claim 1, wherein the resin layer is made of organic resin, the organic resin includes acrylic film-forming resin, phenolic resin-typed film-forming resin, vinyl polymer film-forming resin or polymide film-forming resin, and the resin layer has a thickness in a range of 900-2100 nm.

7. The array substrate of claim 1, wherein the active layer is made of a metal oxide semiconductor material which includes indium gallium zinc oxide, indium oxide, zinc oxide or indium tin zinc oxide, and the active layer has a thickness of 20-60 nm.

8. The array substrate of claim 1, wherein the active layer is made of a metal oxide semiconductor material which includes indium gallium zinc oxide, indium oxide, zinc oxide or indium tin zinc oxide, and the active layer has a thickness of 20-60 nm.

9. The array substrate of claim 2, wherein the first protection layer and the second protection layer are mono-layered or multi-layered composite laminated structures formed of silicon oxide, silicon nitride, hafnium oxide or aluminum oxide, the first protection layer has a thickness in a range of 90-210 nm, and the second protection layer has a thickness in a range of 190-310 nm.

10. A display device, including the array substrate of claim 1.

11. A method for manufacturing an array substrate, the array substrate including a base substrate, and a thin film transistor and driving electrodes provided on the base substrate, the thin film transistor including a gate, a gate insulating layer, an active layer, a source and a drain, and the driving electrodes including a slit-shaped electrode and a plate-shaped electrode which are provided in different layers and at least partially overlap with each other in the orthographic projection direction, wherein the source, the drain and the active layer are formed so that part of their bottom surfaces are located in the same plane, and a resin layer is provided between the thin film transistor and the plate-shaped electrode, the method includes:

forming patterns of the source, the drain and the active layer by two patterning processes so that part of bottom surfaces of the source, the drain and the active layer are located in the same plane; and forming a pattern including the resin layer and the plate-shaped electrode by one patterning process.

12. The method of claim 11, before the step of forming patterns of the source, the drain and the active layer by two patterning processes so that part of bottom surfaces of the source, the drain and the active layer are located in the same plane, further including:

forming a pattern including the gate on the base substrate by one patterning process.

13. The method of claim 12, wherein the step of forming patterns of the source, the drain and the active layer by two patterning processes so that part of bottom surfaces of the source, the drain and the active layer are located in the same plane includes:

forming a gate insulating layer on the base substrate formed with the pattern including the gate, and forming a pattern including the source and the drain on the gate insulating layer so that the source and the drain are provided with an interval therebetween; and on the base substrate subjected to the above step, forming a pattern including the active layer and a first protection layer by one patterning process so that the active layer is provided within a spacer region formed between the source and the drain, and extends to a top surface of the source and a top surface of a part of the drain, bottom surfaces of the source, the drain and a part of the active layer are all located on a top surface of the gate insulating layer, and the first protection layer and the active layer completely overlap with each other in the orthographic projection direction.

14. The method of claim 11, wherein by the step of forming a pattern including the resin layer and the plate-shaped electrode by one patterning process, the thickness of a region, which is provided with the plate-shaped electrode, of the resin layer is made to be larger than that of other regions.

15. The method of claim 14, wherein by the step of forming a pattern including the resin layer and the plate-shaped electrode by one patterning process, the thickness of the region, which is provided with the plate-shaped electrode, of the resin layer is made to be larger than that of other regions by 50-100 nm.

16. The method of claim 11, wherein the step of forming a pattern including the resin layer and the plate-shaped electrode by one patterning process includes:

forming a resin material layer film, and forming a first conductive layer film on the resin material layer film;

performing exposure on the resin material layer film using a half tone mask plate or a gray tone mask plate wherein a region of the resin material layer film corresponding to the drain is a region at which resin material is completely removed, a region of the resin material layer film corresponding to the plate-shaped electrode is a region at which resin material is completely remained, and other regions are regions at which resin material is partially remained; and performing development on the base substrate subjected to the above steps to form a pattern including the resin layer and the plate-shaped electrode.

17. The method of claim 11, further including:
on the base substrate formed with the plate-shaped electrode, forming a pattern including a second protection layer by one patterning process; and
on the base substrate subjected to the above step, forming a pattern including the slit-shaped electrode by one patterning process.

18. The method of claim 17, wherein the plate-shaped electrode is a common electrode, and the slit-shaped electrode is a pixel electrode; or the plate-shaped electrode is a pixel electrode, and the slit-shaped electrode is a common electrode, the method further including:

forming a pattern including a common electrode line simultaneously with forming the pattern including the gate;

forming a fourth via hole in a region of the gate insulating layer corresponding to the common electrode line simultaneously with forming the gate insulating layer;

forming a first via hole in a region of the resin layer corresponding to the drain and a second via hole in a region of the resin layer corresponding to the common electrode line simultaneously with forming the pattern including the resin layer; and forming a third via hole in a region of the second protection layer corresponding to the drain simultaneously with forming the second protection layer;

wherein the pixel electrode is electrically connected to the drain through the first via hole and the third via hole, and the common electrode is electrically connected to the common electrode line through the second via hole and the fourth via hole.

\* \* \* \* \*